(12) United States Patent  (10) Patent No.: US 9,202,861 B1
Mao  (45) Date of Patent: Dec. 1, 2015

(54) STRUCTURE OF CAPACITOR

(71) Applicant: United Microelectronics Corp., Hsinchu (TW)

(72) Inventor: Yong-Ji Mao, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/812,275

(22) Filed: Jul. 29, 2015

Related U.S. Application Data

(62) Division of application No. 14/309,404, filed on Jun. 19, 2014, now Pat. No. 9,136,317.

(30) Foreign Application Priority Data

May 29, 2014 (CN) .......................... 2014 1 0235895

(51) Int. Cl.
*H01L 21/02* (2006.01)
*H01L 49/02* (2006.01)
*H01L 27/08* (2006.01)
*H01L 23/522* (2006.01)

(52) U.S. Cl.
CPC ............. *H01L 28/60* (2013.01); *H01L 23/5223* (2013.01); *H01L 27/0805* (2013.01); *H01L 28/40* (2013.01)

(58) Field of Classification Search
CPC .... H01G 4/228; H01G 4/33; H01L 21/76838; H01L 27/0233; H01L 27/1085; H01L 23/5223; H01L 27/0805; H01L 28/40; Y10T 29/417; A43B 7/025
USPC ........... 257/298, 296, 532, 310, 700, 40, 309; 438/425, 254, 758, 243, 253, 397, 396, 438/736, 386
See application file for complete search history.

(56) References Cited

U.S. PATENT DOCUMENTS

| | | | | | |
|---|---|---|---|---|---|
| 5,158,905 | A | * | 10/1992 | Ahn ................... | H01L 21/32139 257/309 |
| 5,266,512 | A | * | 11/1993 | Kirsch ..................... | H01L 28/91 257/E21.019 |
| 5,656,532 | A | * | 8/1997 | Tseng ............... | H01L 27/10852 257/E21.648 |
| 5,744,833 | A | * | 4/1998 | Chao ................. | H01L 27/10852 257/296 |
| 5,752,182 | A | * | 5/1998 | Nakatsuka ........... | H01L 23/645 257/E25.029 |
| 5,770,499 | A | * | 6/1998 | Kwok ............... | H01L 27/10817 257/E21.008 |
| 5,905,281 | A | * | 5/1999 | Wu .................... | H01L 27/10852 257/306 |
| 6,002,574 | A | * | 12/1999 | Metzler .................... | H01G 4/08 257/E21.019 |
| 6,077,739 | A | * | 6/2000 | Chang ............... | H01L 27/10861 257/E21.651 |
| 6,083,789 | A | * | 7/2000 | Huang .............. | H01L 27/10852 257/E21.019 |
| 6,084,261 | A | * | 7/2000 | Wu .................... | H01L 27/10817 257/308 |

(Continued)

*Primary Examiner* — Mohammed Shamsuzzaman
(74) *Attorney, Agent, or Firm* — J.C. Patents

(57) ABSTRACT

A capacitor including a substrate, a conductive layer, a middle dielectric material layer, a first dielectric material layer, and a second dielectric material layer is provided. The conductive layer includes a first electrode and a second electrode, and the conductive layer is located over the substrate. The middle dielectric material layer is located between the first electrode and the second electrode. The first dielectric material layer is located between the middle dielectric material layer and the first electrode. The second dielectric material layer is located between the middle dielectric material layer and the second electrode. The dielectric constant of the middle dielectric material layer is different from the dielectric constants of the first dielectric material layer and the second dielectric material layer.

7 Claims, 9 Drawing Sheets

(56) References Cited

U.S. PATENT DOCUMENTS

| | | | |
|---|---|---|---|
| 6,323,099 B1 | 11/2001 | Long et al. | |
| 6,391,708 B1* | 5/2002 | Liao | H01L 28/92 257/E21.02 |
| 6,638,830 B1 | 10/2003 | Tsai et al. | |
| 6,790,780 B2 | 9/2004 | Kim et al. | |
| 7,265,379 B2* | 9/2007 | Sandberg | B82Y 10/00 257/40 |
| 7,615,440 B2 | 11/2009 | Felsner et al. | |
| 7,696,553 B2* | 4/2010 | Nakamura | H01L 28/91 257/300 |
| 8,071,439 B2* | 12/2011 | Hirota | H01L 21/76816 257/301 |
| 8,343,845 B2* | 1/2013 | Kim | H01G 4/01 257/296 |
| 8,354,703 B2* | 1/2013 | Horak | H01L 21/3105 257/306 |
| 2002/0081814 A1* | 6/2002 | Ning | H01L 28/90 438/386 |
| 2003/0183862 A1* | 10/2003 | Jin | H01L 23/5223 257/301 |
| 2004/0063300 A1* | 4/2004 | Chi | H01L 21/76224 438/425 |
| 2004/0188826 A1* | 9/2004 | Palanduz | H01L 23/49822 257/700 |
| 2004/0232469 A1* | 11/2004 | Fukuzumi | H01L 28/91 257/310 |
| 2004/0241401 A1* | 12/2004 | Hunt | H01G 4/012 428/209 |
| 2005/0186802 A1* | 8/2005 | Busch | H01L 21/0332 438/736 |
| 2006/0079049 A1* | 4/2006 | Kundalgurki | H01L 27/10852 438/243 |
| 2006/0124982 A1* | 6/2006 | Ho | H01L 27/0805 257/304 |
| 2007/0001203 A1* | 1/2007 | Lehr | H01L 29/945 257/296 |
| 2007/0037405 A1* | 2/2007 | Kim | H01L 23/5223 438/758 |
| 2007/0267674 A1* | 11/2007 | Lin | H01L 27/306 257/306 |
| 2009/0108402 A1* | 4/2009 | Bae | H01L 28/91 257/532 |
| 2010/0052099 A1* | 3/2010 | Chang | H01L 23/481 257/535 |
| 2010/0196592 A1* | 8/2010 | Kim | H01G 4/008 427/79 |
| 2010/0207246 A1* | 8/2010 | Booth, Jr. | H01L 28/87 257/232 |
| 2011/0204524 A1* | 8/2011 | Hannon | H01L 21/76251 257/774 |
| 2012/0080771 A1* | 4/2012 | Yang | H01L 23/5223 257/532 |
| 2012/0104552 A1* | 5/2012 | Kim | H01G 4/002 257/535 |
| 2012/0181658 A1* | 7/2012 | Mohammed | H01G 4/06 257/532 |
| 2013/0049089 A1* | 2/2013 | Baars | H01L 21/84 257/301 |
| 2013/0148259 A1* | 6/2013 | Masuda | H01G 4/012 361/303 |
| 2013/0320433 A1* | 12/2013 | Cho | H01L 21/28026 257/329 |
| 2014/0145299 A1* | 5/2014 | Kalnitsky | H01L 28/91 257/532 |
| 2014/0284671 A1* | 9/2014 | Hung | H01L 21/28 257/296 |
| 2014/0308794 A1* | 10/2014 | Lee | H01L 21/76855 438/381 |

* cited by examiner

STRUCTURE OF CAPACITOR

CROSS-REFERENCE TO RELATED APPLICATION

This application is a divisional application of and claims the priority benefit of U.S. application Ser. No. 14/309,404, filed on Jun. 19, 2014, now allowed, which claims the priority benefits of China application serial no. 201410235895.7, filed on May 29, 2014. The entirety of each of the above-mentioned patent applications is hereby incorporated by reference herein and made a part of this specification.

BACKGROUND OF THE INVENTION

1. Field of the Invention

The invention relates to a semiconductor device and a fabricating method thereof, and particular relates to a capacitor and a fabricating method thereof 2. Description of Related Art With great advances in technologies, semiconductor devices have found increasing number of applications. A large number of semiconductor devices each having a different function is used inside computers, communication equipment and consumer electronic products. Therefore, integrated semiconductor components manufactured in accordance with different requirements, such as an application specific integrated circuit (ASIC), has been one way to satisfy clients' demands.

A mixed mode circuit (MMC) is a type of ASIC where a capacitor and a complementary metal oxide semiconductor (CMOS) are integrated. In the mixed mode circuit described above, the capacitor is a basic and an important electronic component. Especially for analog circuit, capacitor is an important and indispensable component for basic building block such as sample and hold circuits, analog to digital (A/D) converters, digital to analog (D/A) converters or switched capacitor filters, etc.

SUMMARY OF THE INVENTION

The embodiments of the invention provide a capacitor having an increased electric capacity per unit area.

The embodiments of the invention also provide a fabricating method of a capacitor. The fabricating method may be integrated with the conventional fabricating process and capable of increasing an electric capacity per unit area.

The invention provides a capacitor, including a substrate, a conductive layer, a middle dielectric material layer, a first dielectric material layer, and a second dielectric material layer. The conductive layer includes a first electrode and a second electrode and is located on the substrate. The middle dielectric material layer is located between the first electrode and the second electrode. The first dielectric material layer is located between the middle dielectric material layer and the first electrode. The second dielectric material layer is located between the middle dielectric material layer and the second electrode. A dielectric constant of the middle dielectric material layer is different from dielectric constants of the first dielectric material layer and the second dielectric material layer.

According to an embodiment of the invention, the first electrode of the capacitor includes a first comb electrode, and the second electrode of the capacitor includes a second comb electrode.

According to an embodiment of the invention, a first shank portion of the first comb electrode and a second shank portion of the second comb electrode are disposed correspondingly with respect to each other, and a plurality of first comb portions of the first comb electrode and a plurality of second comb portions of the second comb electrode are alternately arranged.

According to an embodiment of the invention, a material of the conductive layer includes copper, copper aluminium alloy, copper aluminium silicon alloy, tantalum (Ta), tantalum nitride (TaN), titanium (Ti), titanium nitride (TiN), or a combination thereof.

According to an embodiment of the invention, the capacitor further includes a first capping layer, located below the first electrode, the first dielectric material layer, the middle dielectric material layer, the second dielectric material layer, and the second electrode. The capacitor further includes a second capping layer, located above the first electrode, the first dielectric material layer, the second dielectric material layer, and the second electrode.

According to an embodiment of the invention, materials of the first capping layer and the second capping layer include silicon carbide (SiC), silicon carbon oxynitride (SiCON), or nitrogen-doped silicon carbide or a combination thereof.

According to an embodiment of the invention, the capacitor further includes a third dielectric material layer, located below the first electrode, the first dielectric material layer, the second dielectric material layer, and the second electrode and above the first capping layer, and connected to the first dielectric material layer and the second dielectric material layer.

According to an embodiment of the invention, the first dielectric material layer, the second dielectric material layer, and the third dielectric material layer include a low dielectric constant material, and the middle dielectric material layer includes a high dielectric constant material.

According to an embodiment of the invention, the first dielectric material layer, the second dielectric material layer, and the middle dielectric material layer include a high dielectric constant material.

Based on the above, in the embodiments of the invention, since the dielectric layer in the structure of the capacitor is modified into a composite layer formed of high dielectric constant materials having different dielectric constants, the electric capacity per unit area of the capacitor is increased without enlargement in size. In another embodiment of the invention, the electrical capacity of the capacitor may be further increased by increasing a depth of a trench.

In addition, in the capacitor of the invention, the electrodes of the capacitor may be formed at the same time. Therefore, the capacitor of the invention has the characteristics of having fewer fabricating steps and lower fabricating cost and saving time. In addition, the capacitor fabricating process according to the embodiments of the invention may be further integrated with the conventional metal interconnection fabricating process (e.g., dual damascene process).

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
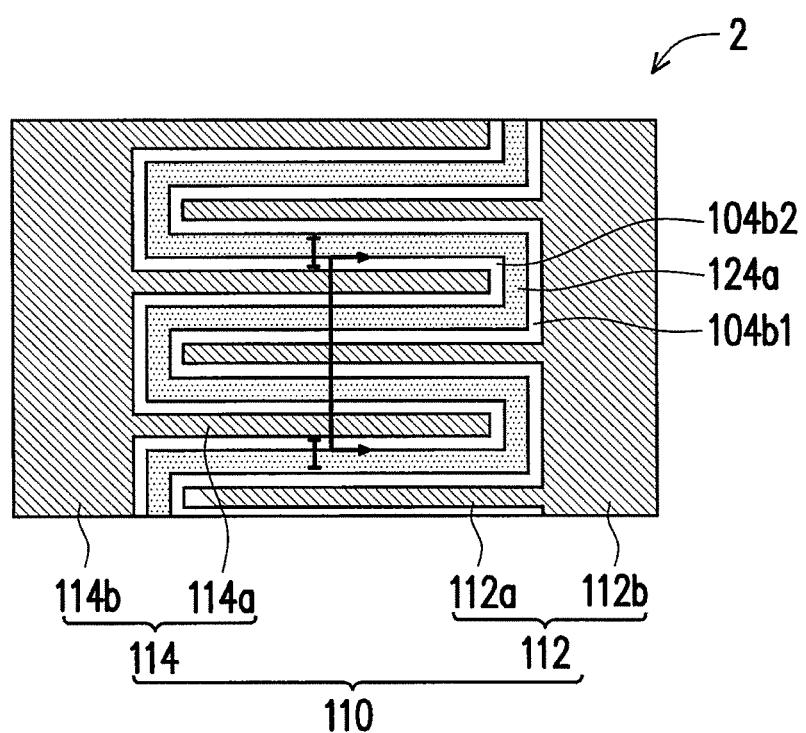
FIG. 1 is a top view illustrating a structure of a capacitor according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a top view illustrating a capacitor according to an embodiment of the invention.

Referring to FIG. 1, a capacitor 2 according to an embodiment of the invention includes a substrate (not shown), a conductive layer 110 located on the substrate, a middle dielectric material layer 124a, a first dielectric material layer 140b1, and a second dielectric material layer 104b2.

The conductive layer 110 includes a first electrode 112 and a second electrode 114. The middle dielectric material layer 124a is located between the first electrode 112 and the second electrode 114. The first dielectric material layer 104b1 is located between the middle dielectric material layer 124a and the first electrode 112. The second dielectric material layer 104b2 is located between the middle dielectric material layer 124a and the second electrode 114.

Continuing referring to FIG. 1, in an embodiment, the first electrode 112 and the second electrode 114 may be comb electrodes, for example. The first electrode 112 includes a plurality of comb portions 112a and a first shank portion 112b. The plurality of first comb portions 112a are arranged in parallel with each other. One end of each of the first comb portions 112a is connected to the first shank portion 112b. The second electrode 114 includes a plurality of second comb portions 114a and a second shank portion 114b. The plurality of second comb portions 114a are arranged in parallel with each other. One end of each of the second comb portions 114a is connected to the second shank portion 114b. The first shank portion 112b of the first electrode 112 and the second shank portion 114b of the second electrode 114 are disposed correspondingly with respect to each other. The plurality of first comb portions 112a of the first electrode 112 and the plurality of second comb portions 114a of the second electrode 114 are alternately disposed. In this embodiment, the first electrode 112 and the second electrode 114 are formed of the same material, and may be formed by patterning the same material layer. A material of the first electrode 112 and the second electrode 114 may be a metal or an alloy, such as copper, copper aluminum alloy, copper aluminum silicon alloy, Ta, TaN, Ti, TiN or a combination thereof A dielectric constant of the middle dielectric layer 124a differs from dielectric constants of the first dielectric material layer 104b1 and the second dielectric material layer 104b2. In an embodiment of the invention, materials of the first dielectric material layer 104b1 and the second dielectric material layer 104b2 includes a low dielectric constant material, and the middle dielectric material layer 124a includes a high dielectric constant material. In another embodiment of the invention, the first dielectric material layer 104b1, the second dielectric material layer 104b2, and the middle dielectric material layer 124a include a high dielectric constant material.

The low dielectric constant material described herein refers to a material having a dielectric constant lower than 4 such as fluorosilicate glass (FSG), silsesquioxanes such as hydrogen silsesquioxnane (HAQ), methyl silsesquioxane (MSQ), and hybrido-organo siloxane polymer (HOSP), aromatic hydrocarbon compounds such as SiLK, organosilicate glass such as black diamond (BD), trimethylsilane (3MS), and tetramethylsilane (4MS), parylene, fluoro-polymers such as perfluorocyclobutyl polymers (PFCB), CYTOP, and Teflon, poly(arylethers) such as PAE-2 and fluorinated poly (arylethers) (FLARE), and porous polymers such as XLK, nanofoam, aerogel, and coral, etc., for example.

The high dielectric constant material described herein refers to a material having a dielectric constant higher than 4, such as a material selected from a group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1.

The capacitor according to the embodiments of the invention may be fabricated according to a variety of methods. Several embodiments are described below for an illustrative purpose. However, the invention is not limited thereto.

Figure 2A:
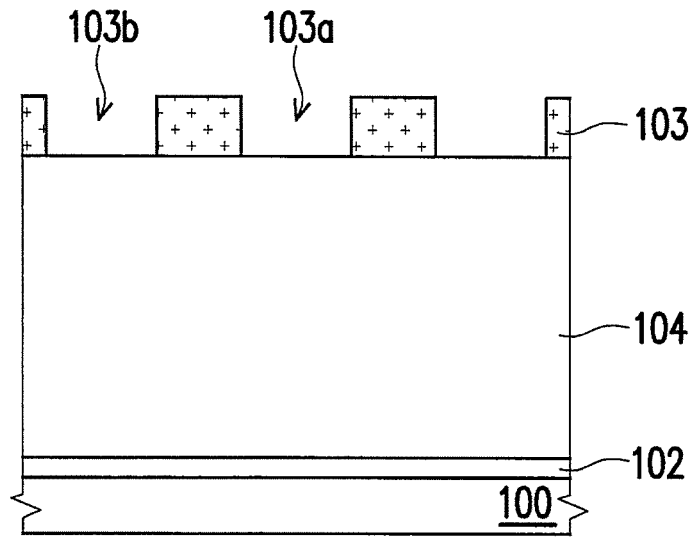
FIGS. 2A to 2F are cross-sectional views illustrating a fabricating method of a capacitor according to a first embodiment of the invention.
Figure 2B:
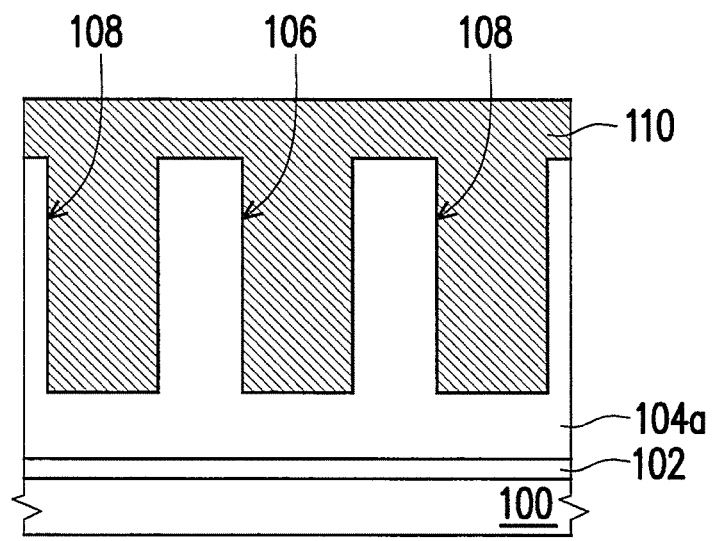
Figure 2C:
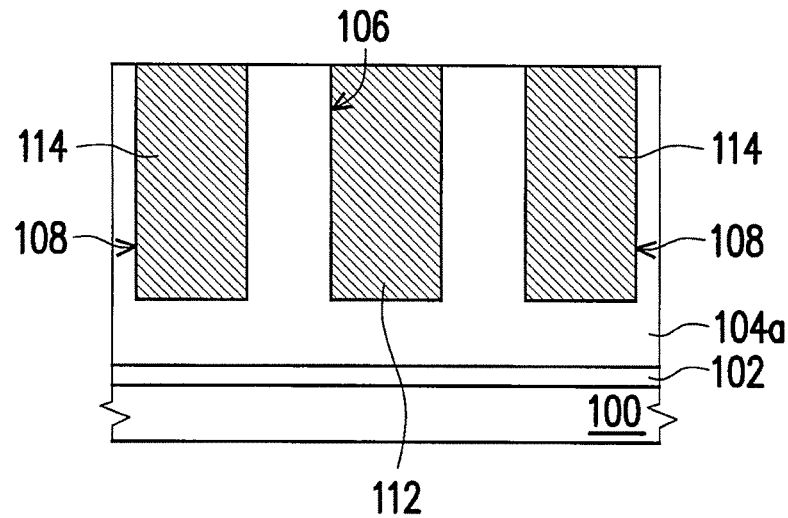
Figure 2D:
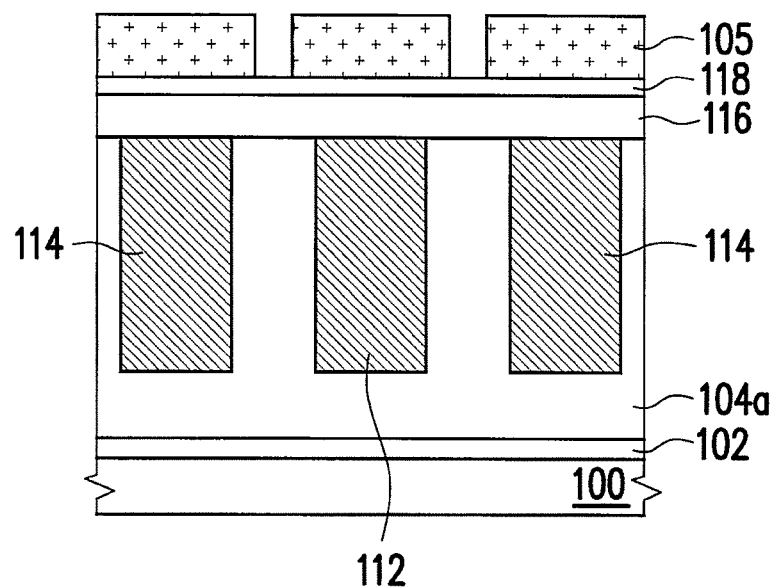
Figure 2E:
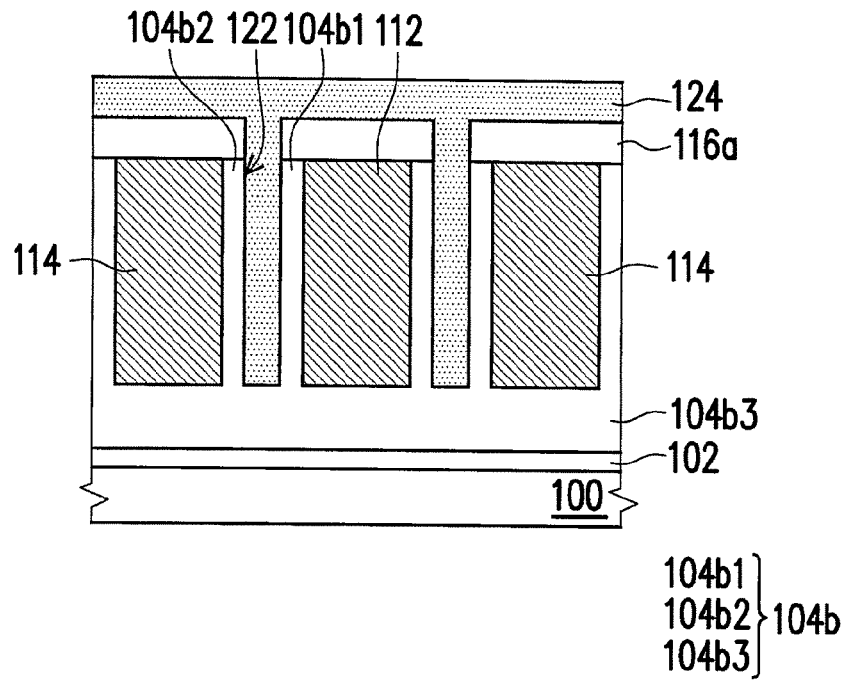
Figure 2F:
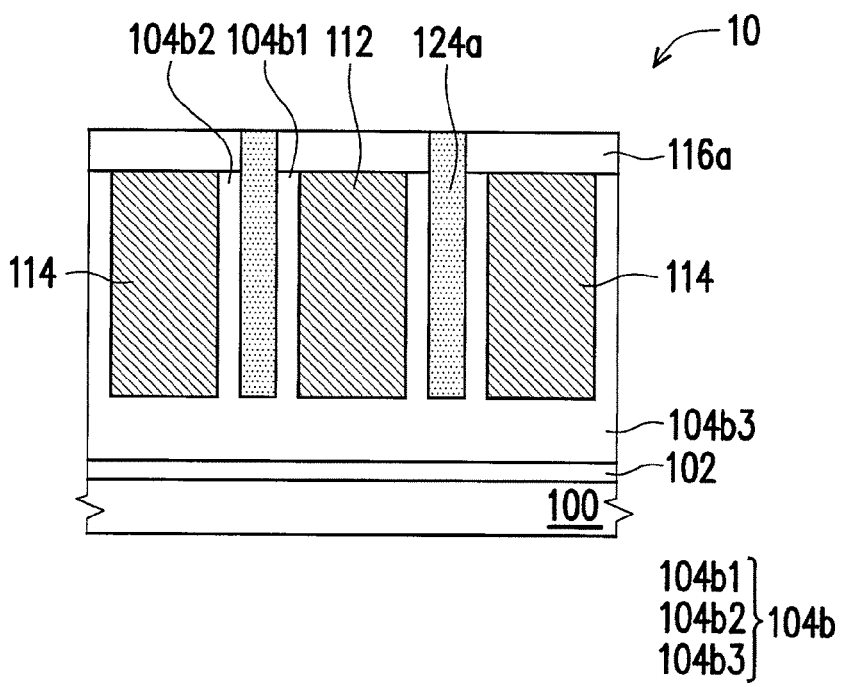

FIGS. 2A to 2F are cross-sectional views illustrating a fabricating method of a capacitor according to a first embodiment of the invention. FIG. 2A is a cross-sectional view corresponding to a cross-sectional line I-I shown in FIG. 3A. FIG. 2C is a cross-sectional view corresponding to a cross-sectional line I-I shown in FIG. 3B. FIG. 2F is a cross-sectional view corresponding to a cross-sectional line I-I shown in FIG. 1.

Figure 3A:
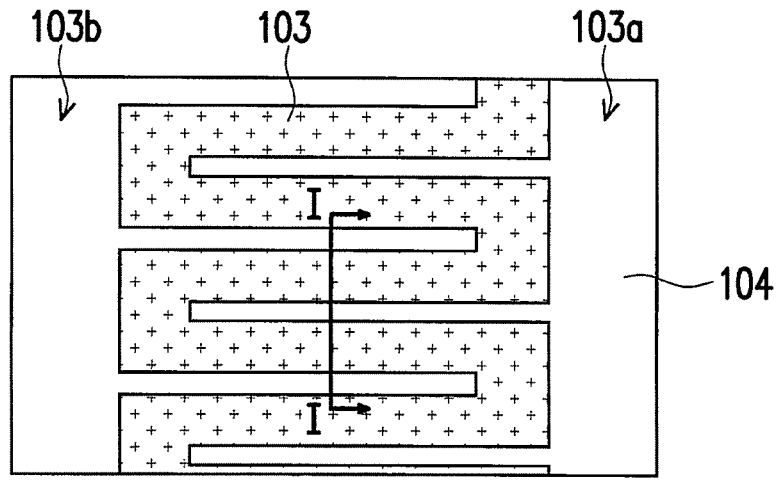
FIGS. 3A and 3B are top views illustrating a fabricating method of a capacitor according to an embodiment of the invention.

Referring to FIGS. 2A and 3A, a substrate 100 is provided. The substrate 100 may be formed of at least one semiconductor or semiconductor compound material selected from a group consisting of Si, Ge, SiGe, GaP, GaAs, SiC, SiGeC, InAs, and InP. A material of the substrate 100 may also be silicon on insulator (SOI). The substrate 100 may be a semiconductor, a semiconductor compound, or a SOI that components are already formed thereon. The components, which are not shown in the drawings, are a metal oxide transistor, a contact, a wire, or a via in a metal interconnect, a crystalline silicon base material, a dielectric layer, or a combination thereof, for example.

Then, a first capping layer 102 and a dielectric material layer 104 are formed on the substrate 100. A material of the first capping layer 102 is silicon carbide, silicon carbon oxynitride, or nitrogen-doped silicon carbide or a combination thereof, for example, and a forming method of the first capping layer 102 is chemical vapor deposition, for example. A material of the dielectric material layer 104 is the low dielectric constant materials described above, for example. A method of forming the dielectric material layer 104 is chemical vapor deposition or spin coating, for example. Then, a patterned mask layer 103 is formed on the dielectric material layer 104. The patterned mask layer 103 has openings 103a and 103b therein. Viewing from a top view, the openings 103a and 103b are in a comb-like shape, for example. A material of the patterned mask layer 103 is a photoresist, for example.

Then, referring to FIGS. 2A, 2B, and 3A, the dielectric material layer 104 is etched by using the patterned mask layer 103 as a mask, so as to form a patterned dielectric material layer 104a. The patterned dielectric material layer 104a includes a first opening 106 and a second opening 108. The patterned dielectric material layer 104 is exposed by bottoms of the first opening 106 and the second opening 108. A method of etching the dielectric material layer 104 is wet etching or dry etching, for example. Then, the patterned mask layer 103 is removed. A method of removing the patterned mask layer 103 is dry stripping, wet stripping, or a combination thereof, for example. Then, a conductive material layer 110 is formed on the substrate 100 and is filled into the first opening 106 and the second opening 108. A material of the conductive material layer 110 is copper, copper aluminum alloy, copper aluminum silicon alloy, Ta, TaN, Ti, TiN or a combination thereof, for example. A method of forming the conductive material layer 110 is plating or sputtering, for example.

Figure 3B:
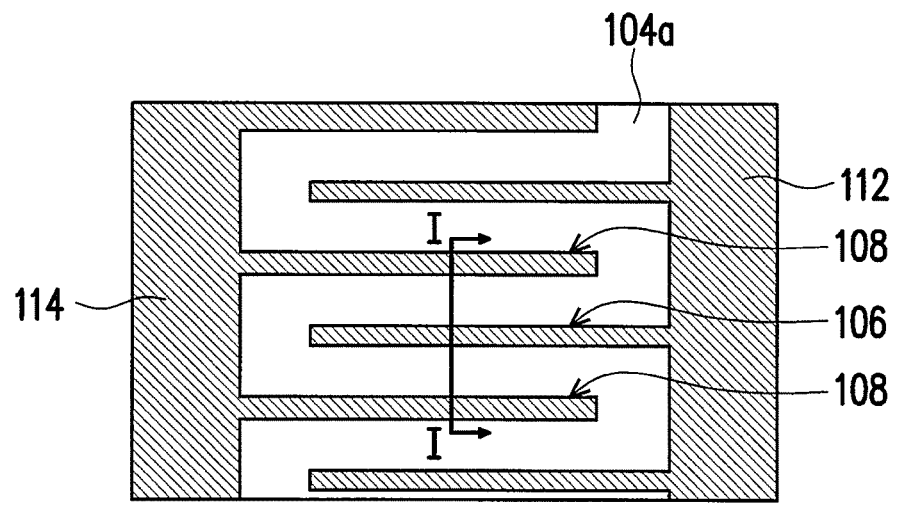

Then, referring to FIGS. 2C and 3B, the conductive material layer 110 is removed except the conductive material layer 110 in the first opening 106 and the second opening 108, so that the patterned dielectric material layer 104a is exposed. Here, the first electrode 112 is formed in the first opening 106, and the second electrode 114 is formed in the second opening 108 at the same time. A method of removing the conductive material layer 110 is chemical mechanic polishing, for example.

Then, referring to FIG. 2D, a second capping layer 116, a middle layer 118, and a patterned mask layer 105 are formed on the substrate 100. The patterned dielectric material layer 104a, the first electrode 112, and the second electrode 114 are covered by the second capping layer 116. A material of the second capping layer 116 may be the same as the material of the first capping layer 102, such as silicon carbide, silicon carbon oxynitride, nitrogen-doped silicon carbide, or a combination thereof, for example. A method of forming the second capping layer 116 is chemical vapor deposition, for example. A material of the middle layer 118 is a porous low dielectric constant material layer, for example. A method of forming the middle layer 118 is chemical vapor deposition or spin coating, for example. The patterned mask layer 105 is a photoresist, for example. A bottom anti-reflection coating (BARC) layer (not shown) may be disposed between the middle layer 118 and the patterned mask layer 105.

Then, referring to FIGS. 2D and 2E, the middle layer 118, the second capping layer 116, and the patterned dielectric material layer 104a are etched by using the patterned mask layer 105 as a mask, so that a second capping layer 116a and a dielectric material layer 104b are formed. The second capping layer 116a and the dielectric material layer 104b have a third opening 122 therein. The dielectric material layer 104b includes the first dielectric material layer 104b1, the second dielectric material layer 104b2, and a third dielectric material layer 104b3. The first dielectric material layer 104b1 is located on a sidewall of the first electrode 112. The second dielectric material layer 104b2 is located on a sidewall of the second electrode 114. The third dielectric material layer 104b3 is located below the first electrode 112, the first dielectric material layer 104b1, the second dielectric material layer 104b2, and the second electrode 114 and above the first capping layer 102. Then, the patterned mask layer 150 and the middle layer 118 are removed. A method of removing the patterned mask layer 105 is dry stripping, wet stripping, or a combination thereof, for example. A method of removing the middle layer 118 may be etching, such as dry etching or wet etching, for example. Then, a middle dielectric material layer 124 is formed on the substrate 100. The middle dielectric material layer 124 is filled into the third opening 122. A material of the middle dielectric material layer 124 is a high dielectric constant material, for example. The high dielectric constant material is the materials described above. A method of forming the middle dielectric material layer 124 is chemical vapor deposition, for example.

Then, referring to FIGS. 2E, 2F, and 1, the middle dielectric material layer 124 is removed except the middle dielectric material layer 124 in the third opening 122, so that the middle dielectric material layer 124a is formed. A method of removing the middle dielectric material layer 124 except the middle dielectric material layer 124 in the third opening 122 is chemical mechanical polishing, for example. For the clarity of illustration, the second capping layer 116a shown in FIG. 2H is omitted in the top view in FIG. 1.

Referring to FIGS. 2F and 1, a capacitor 10 according to the first embodiment of the invention includes the substrate 100, the first electrode 112, the second electrode 114, the middle dielectric material layer 124a, the first dielectric material layer 104b1, and the second dielectric material layer 104b2. The materials and configuration of the components are in accordance the illustration and description of FIG. 1. In this embodiment, a material of the middle dielectric material layer 124a is the high dielectric constant materials described above, for example, and the materials of the first and second dielectric material layers 104b1 and 104b2 are the same, such as the low dielectric constant materials described above, for example.

Besides, the capacitor 10 according to the first embodiment of the invention further includes the first capping layer 102 and the patterned second capping layer 116a. The first capping layer 102 is located below the first electrode 112, the first dielectric material layer 104b1, the middle dielectric material layer 124a, the second dielectric material layer 104b2, and the second electrode 114. The patterned second capping layer 116a is located above the first electrode 112, the first dielectric material layer 104b1, the second dielectric material layer 104b2, and the second electrode 114.

In addition, the capacitor 10 according to the first embodiment of the invention may further include the third dielectric material layer 104b3. The third dielectric material layer 104b3 is located below the first electrode 112, the first dielectric material layer 104b1, the second dielectric material layer 104b2, and the second electrode 114 and above the first capping layer 102. The third dielectric material layer 104b3 is connected to the first dielectric material layer 104b1 and the second dielectric material layer 104b2 to form the dielectric material layer 104b together. A material of the third dielectric material layer 104b3 may be the same as the materials of the first dielectric material layer 104b1 and the second dielectric material layer 104b2, such as the low dielectric constant materials.

FIGS. 4A to 4D are cross-sectional schematic views illustrating the fabricating a capacitor according to a second embodiment of the invention. The fabricating work flow of the capacitor shown in FIGS. 4A to 4D is partially similar to the fabricating the capacitor shown in FIGS. 2A to 2F. Therefore, like elements are referred to by like reference symbols, and repeated description will not be reiterated below. For example, a patterned dielectric material layer 204a of FIG. 4B corresponds to the patterned dielectric material layer 104a of FIG. 2B.

Figure 4A:
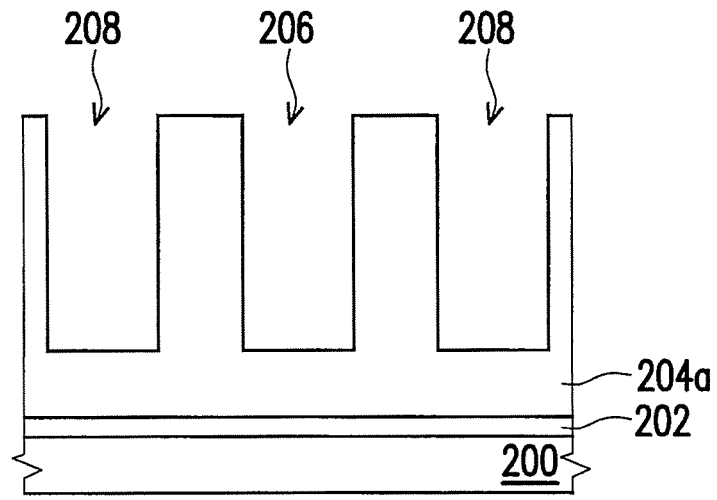
FIGS. 4A to 4D are cross-sectional views illustrating a fabricating method of a capacitor according to a second embodiment of the invention.

First of all, referring to FIG. 4A, a first capping layer 202 and a dielectric material layer 204 are formed on a substrate 200 according to the method of the first embodiment. The patterned dielectric material layer 204a has a first opening 206 and a second opening 208.

Figure 4B:
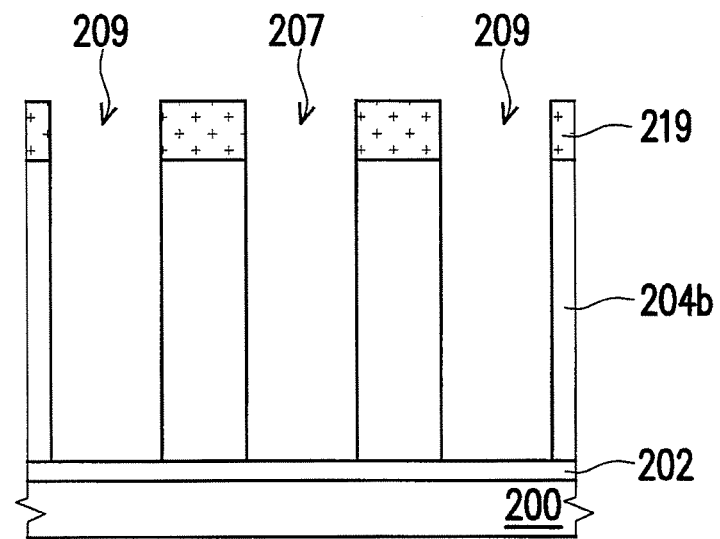

Then, referring to FIG. 4B, a patterned mask layer 219 is formed on the patterned dielectric material layer 204a. A material of the patterned mask layer 219 is a photoresist, for example. Then, using the pattered mask layer 219 as a mask, an etching process (e.g., a dry etching process) is performed to etch the patterned dielectric material layer 204a exposed by bottoms of the first opening 206 and the second opening 208 so as to form a re-patterned dielectric material layer 204b. The re-patterned dielectric material layer 204b has a first opening 207 and a second opening 209 therein. Compared to the first opening 206 and the second opening 208 shown in FIG. 4A, the first opening 207 and the second opening 209 have greater depths. In addition, the first capping layer 202 is exposed by bottoms of the first openings 207 and the second opening 209.

Figure 4C:
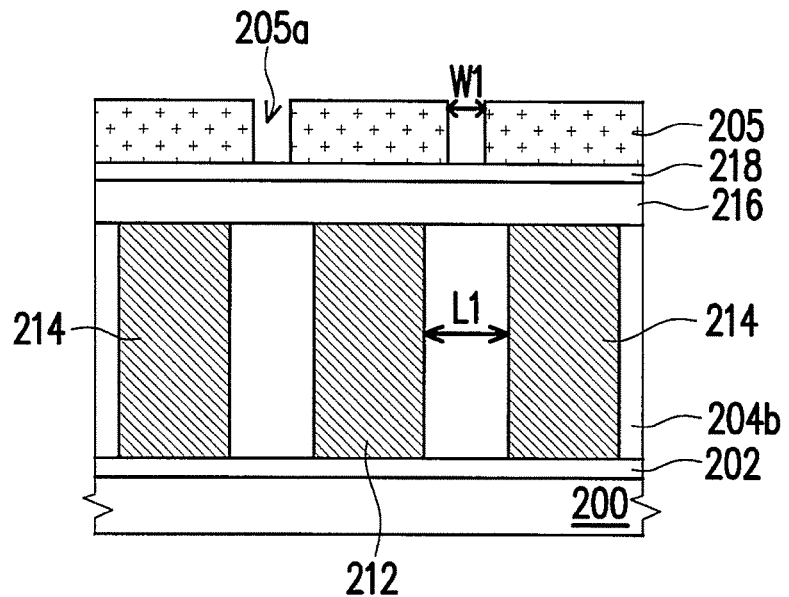

Then, referring to FIGS. 4B and 4C, the patterned mask layer 219 is removed. A method of removing the patterned mask layer 219 is dry stripping, wet stripping, or a combination thereof, for example. Then, a first electrode 212 and a second electrode 214 are formed in the first opening 207 and the second opening 209 according to the previously described method. Then, a second capping layer 216, a middle layer 218, and a patterned mask layer 205 are formed on the substrate 200. A width W1 of an opening 205a of the patterned mask layer 205 is smaller than a distance L1 between the first electrode 212 and the second electrode 214.

Figure 4D:
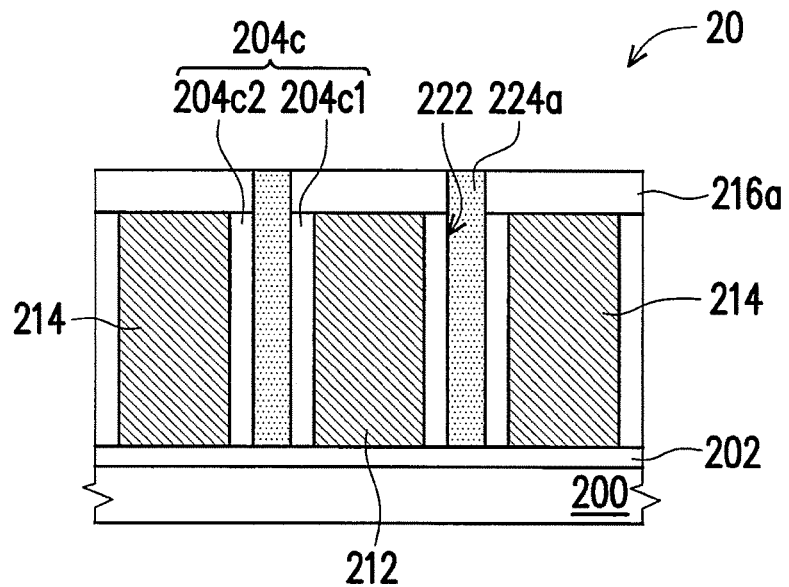

Then, referring to FIGS. 4C and 4D, a portion of the dielectric material layer 204b that is between the first electrode 212 and the second electrode 214 is removed by using the mask layer 205 as a mask, so that a second capping layer 216a and a dielectric material layer 204c are formed. The second capping layer 216a and the dielectric material layer 204c have a third opening 222 therein. The dielectric material layer 204c includes a first dielectric material layer 204c1 and a second dielectric material layer 204c2. The first dielectric material layer 204c1 is located on a sidewall of the first electrode 212. The second dielectric material layer 204c2 is located on a sidewall of the second electrode 214. Afterwards, the patterned mask layer 205 and the middle layer 218 are removed, and then a middle dielectric material layer 224a is formed in the third opening 222. Thus, a capacitor 20 is formed. A top view of the capacitor 20 in FIG. 4D is similar to FIG. 1.

Referring to FIG. 4D, the capacitor 20 includes the substrate 200, the first electrode 212, the second electrode 214, the middle dielectric material layer 224a, the first dielectric material layer 204c1, the second dielectric material layer 204c2, the first capping layer 202, and the second capping layer 216a. The structure of the capacitor 20 is similar to that of the capacitor 10. The configuration and materials of the components may be referred to the description of the first embodiment corresponding to FIGS. 1 and 2A to 2F. However, the capacitor 20 of the second embodiment and the capacitor 10 of the first embodiment differ in that in the second embodiment, the first opening 207 and the second opening 209 in the patterned dielectric material layer 204b of the second embodiment are deeper. Thus, heights of the first electrode 212, the second electrode 214, the middle dielectric material layer 224a, the first dielectric material layer 204c1 and the second dielectric material layer 204c2 are increased, and the electric capacity may be further increased.

Referring to FIGS. 2F and 4D, in the capacitor 10 and the capacitor 20 respectively described in the first embodiment and the second embodiment of the invention, the first dielectric material layers 104b1 and 204b1 and the second dielectric material layers 104b2 and 204b2 are not limited to be formed of a low dielectric constant material. The scope of the invention includes that the dielectric constants of the middle dielectric material layers 124a and 224a differ from the dielectric constants of the first dielectric material layers 104b1 and 204ba and the second dielectric material layers 104b2 and 204b2. In a capacitor of the third embodiment, the first electrode and the second electrode are high dielectric constant material layers having different dielectric constants.

FIGS. 5A to 5D are cross-sectional view illustrating a fabricating method of a capacitor according to a third embodiment of the invention. The fabricating method of the capacitor shown in FIGS. 5A to 5D is partially similar to the fabricating method of the capacitor shown in FIGS. 4A to 4D. Therefore, like elements are referred to by like reference symbols, and repeated description is omitted. For example, a patterned dielectric material layer 304b of FIG. 5A corresponds to the patterned dielectric material layer 204b of FIG. 4B.

Figure 5A:
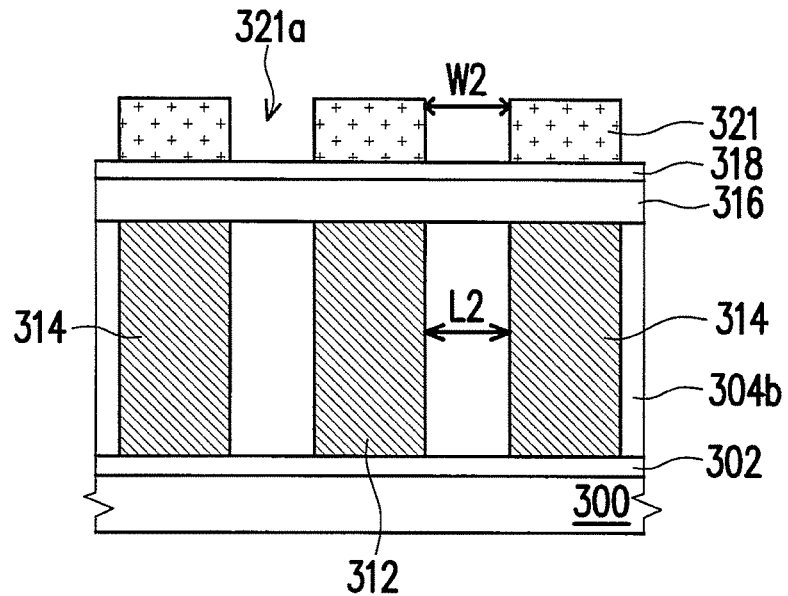
FIGS. 5A to 5D are cross-sectional view illustrating a fabricating method of a capacitor according to a third embodiment of the invention.

First of all, referring to FIG. 5A, a first capping layer 302, a first electrode 312, a second electrode 314, a patterned dielectric material layer 304b, a second capping layer 316, and a middle layer 318 are formed on a substrate 300 according to the methods of the first and second embodiments. Then, a patterned mask layer 321 is formed on the middle layer 318. The patterned mask layer 321 of the third embodiment is different from the patterned mask layer 205 of the second embodiment. More specifically, a width W2 of an opening 321a of the patterned mask layer 321 is substantially equal to a distance L2 between the first electrode 312 and the second electrode 314. The patterned mask layer 321 is a photoresist, for example.

Figure 5B:
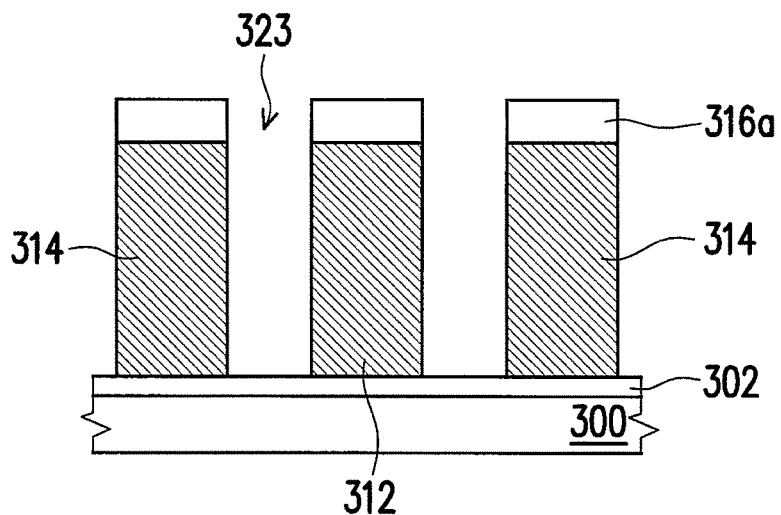

Then, referring to FIGS. 5A and 5B, the dielectric material layer 304b is removed by performing an etching process (e.g., a dry etching or a wet etching process) using the patterned mask layer 321 as a mask. Since the width W2 of the opening 321a of the patterned mask layer 321 is substantially equal to the distance L2 between the first electrode 312 and the second electrode 314, an opening 323 may be formed by completely removing the dielectric material layer 304b between the first electrode 312 and the second electrode 314. Sidewalls of the first electrode 312 and the second electrode 314 and a sidewall of the first capping layer 302 are exposed by the opening 323. Then, the patterned mask layer 321 and the middle layer 318 are removed. A method of removing the patterned mask layer 321 is dry stripping, wet stripping, or a combination thereof, for example. A method of removing the middle layer 318 is etching, such as dry etching or wet etching, for example.

Figure 5C:
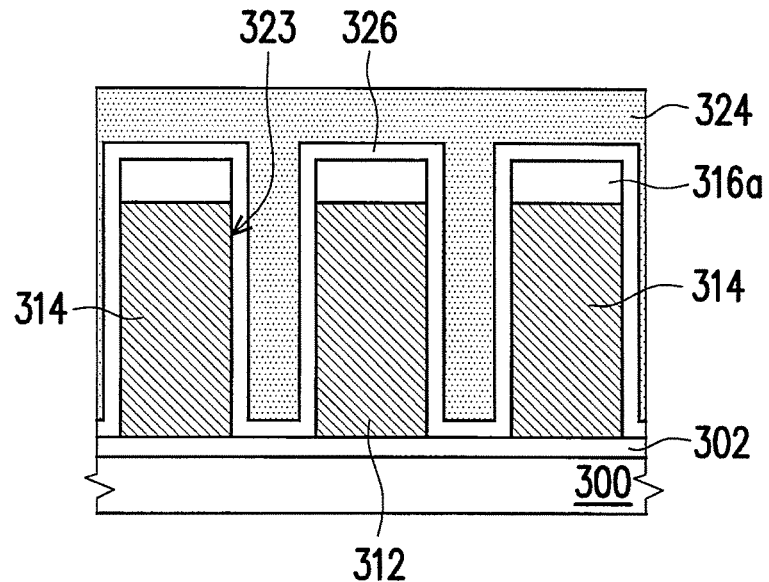

Then, referring to FIG. 5C, a dielectric layer 326 and a middle dielectric material layer 324 are formed on the substrate 300. The dielectric layer 326 may conformally covers the first electrode 312, the second electrode 314, the first capping layer 302, and the second capping layer 316a. A method of forming the dielectric layer 326 is atomic level deposition (ALD), for example. A material of the dielectric layer 326 is the high dielectric constant materials or the low dielectric constant materials described above, for example. A material of the middle dielectric material layer 324 is the high dielectric constant materials described above, for example. The dielectric layer 326 has a different dielectric constant from that of the middle dielectric material layer 324. In an embodiment, materials of the dielectric layer 326 and the middle dielectric material layer 324 are high dielectric constant material layers, but the dielectric constant of the dielectric layer 326 and the dielectric constant of the middle dielectric material layer 324 are different.

Figure 5D:
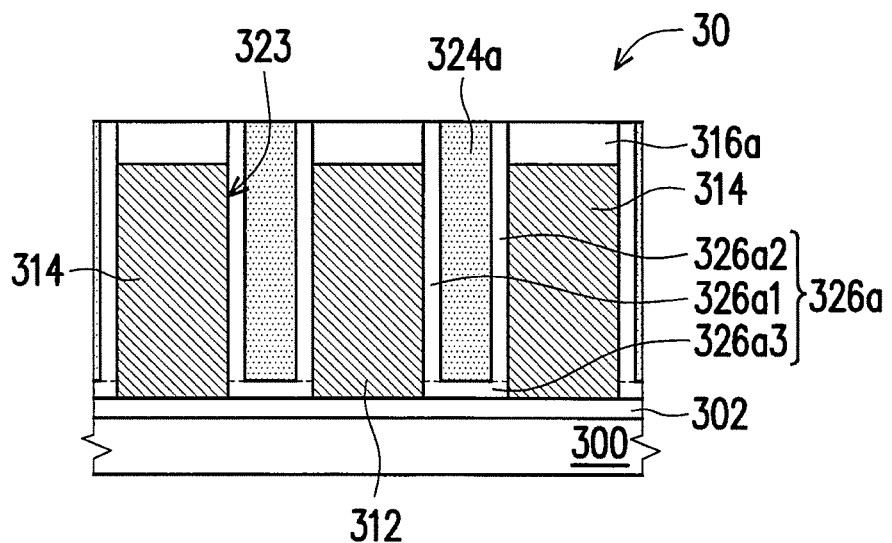

Then, referring to FIGS. 5D and 1, the dielectric layer 326 and the middle dielectric material layer 324 are removed except the dielectric layer 326 and the middle dielectric material layer 324 in the third opening 323, so that a middle dielectric material layer 324a, a patterned dielectric layer 326a, and a second capping layer 316a are exposed. A method of removing the dielectric layer 326 and the middle dielectric material layer 324 except the dielectric layer 326 and the middle dielectric material layer 324 in the third opening 323 is chemical mechanical polishing or etching-back. Thus, a capacitor 30 is formed. A top view of the capacitor 30 in FIG. 5D is similar to FIG. 1.

Referring to FIG. 5D, in terms of fabricating methods, the fabricating method of the capacitor 30 of the third embodiment differs from the fabricating method of the capacitor 10 of the first embodiment, as shown in FIG. 2F, and the fabricating method of the capacitor 20 of the second embodiment, as shown in FIG. 4D, in that the patterned dielectric material layer 304b (shown in FIG. 5B) is completely removed, and the patterned dielectric layer 326a (shown in FIG. 5C) is newly formed on the substrate 300 in the third embodiment.

Referring to FIG. 5D, the capacitor 30 includes the substrate 300, the first electrode 312, the second electrode 314, the middle dielectric material layer 324a, the patterned dielectric material layer 326a, the first capping layer 302, and the second capping layer 316a. Except for the patterned dielectric material layer 326a, the configuration and materials of the components are the same as those of the first and second embodiments. In terms of structures, the capacitor 30 of the third embodiment differs from the capacitor 20 (shown in FIG. 4D) of the second embodiment in that the sidewalls of the first electrode 312 and the second electrode 314 and a surface of the first capping layer 302 are completely covered by the patterned dielectric layer 326a. More specifically, the dielectric layer 326a includes a first dielectric layer 326a1, a second dielectric layer 326a2, and a third dielectric layer 326a3. The first dielectric layer 326a1 is located between the first electrode 312 and the middle dielectric material layer 324a. The second dielectric layer 326a2 is located between the second electrode 314 and the middle dielectric material layer 324a. The third dielectric layer 326a3 is located below the middle dielectric material layer 324a and above the first capping layer 302. In addition, the third dielectric layer 326a3 is connected to the first dielectric layer 326a1 and the second dielectric layer 326a2. In addition, through fabricating method of the third embodiment, the patterned dielectric layer 326a may have an even thickness, and an electrical characteristic of the capacitor 30 may be effectively controlled.

In view of the foregoing, in the embodiments of the invention, since the dielectric layer in the structure of the capacitor may include dielectric material layers/dielectric layers having different dielectric constants, the electric capacity per unit area of the capacitor may be increased. In another embodiment of the invention, the electrical capacity of the capacitor may be further increased by performing an additional patterning process to increase a depth of a trench. In addition, in the capacitor of the invention, the electrodes of the capacitor may be formed at the same time. Therefore, the capacitor of the invention has the characteristics of having fewer fabricating steps and lower fabricating cost and saving time. In addition, the capacitor fabricating process according to the embodiments of the invention may be further integrated with the conventional metal interconnection fabricating process (e.g., dual damascene process). In other words, the conductive layer including the first and second electrodes in the capacitor according to the embodiments of the invention may be considered as a metal layer in the metal interconnection layers. Thus, the capacitor having an increased electrical capacity may be fabricated without adding many fabricating steps.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A capacitor, comprising:
a substrate;
a conductive layer, comprising a first electrode and a second electrode and located on the substrate;
a middle dielectric material layer, located between the first electrode and the second electrode;
a first dielectric material layer, located between the middle dielectric material layer and the first electrode;
a second dielectric material layer, located between the middle dielectric material layer and the second electrode;
a first capping layer, located below the first electrode, the first dielectric material layer, the middle dielectric material layer, the second dielectric material layer, and the second electrode;
a second capping layer, located above the first electrode, the first dielectric material layer, the second dielectric material layer, and the second electrode;
a third dielectric material layer, located below the first electrode, the first dielectric material layer, the second dielectric material layer, and the second electrode and above the first capping layer, and connected to the first dielectric material layer and the second dielectric material layer;
wherein a dielectric constant of the middle dielectric material layer is different from dielectric constants of the first dielectric material layer and the second dielectric material layer and a distance between the first electrode and the second electrode is equal to a width of an opening of the second capping layer comprising a total thickness of the first dielectric material layer, the second dielectric material layer and the middle dielectric material layer.

2. The capacitor as claimed in claim 1, wherein the first electrode comprises a first comb electrode, and the second electrode comprises a second comb electrode.

3. The capacitor as claimed in claim 2, wherein a first shank portion of the first comb electrode and a second shank portion of the second comb electrode are disposed correspondingly with respect to each other, and a plurality of first comb portions of the first comb electrode and a plurality of second comb portions of the second comb electrode are alternately arranged.

4. The capacitor as claimed in claim 1, wherein a material of the conductive layer comprises copper, copper aluminum alloy, copper aluminum silicon alloy, Ta, TaN, Ti, TiN or a combination thereof.

5. The capacitor as claimed in claim 1, wherein materials of the first capping layer and the second capping layer comprise silicon carbide, silicon carbon oxynitride, or nitrogen-doped silicon carbide or a combination thereof.

6. The capacitor as claimed in claim 1, wherein:
the first dielectric material layer, the second dielectric material layer, and the third dielectric material layer comprise a low dielectric constant material; and
the middle dielectric material layer comprises a high dielectric constant material.

7. The capacitor as claimed in claim 1, wherein the first dielectric material layer, the second dielectric material layer, and the middle dielectric material layer comprise a high dielectric constant material.

* * * * *